United States Patent [19]

Akiyama

[11] Patent Number: 5,161,114
[45] Date of Patent: Nov. 3, 1992

[54] METHOD OF MANUFACTURING A RETICULE

[75] Inventor: Shin Akiyama, Kasugai, Japan

[73] Assignees: Fujitsu Limited, Kawasaki; Fujitsu VLSI Limited, Kasugai, both of Japan

[21] Appl. No.: 492,134

[22] Filed: Mar. 13, 1990

[30] Foreign Application Priority Data

Mar. 15, 1989 [JP] Japan .................................. 1-062830

[51] Int. Cl.[5] ............................................. G06F 15/20
[52] U.S. Cl. ...................................... 364/490; 364/491
[58] Field of Search ...................... 250/491.1; 364/490, 364/491

[56] References Cited

U.S. PATENT DOCUMENTS 3,955,072  5/1976  Johannsmeier et al. ......... 364/490 X
4,103,998  8/1978  Nakazawa et al. .............. 364/490 X
4,777,641 10/1988  Inagaki et al. ................. 250/491.1 X
4,878,177 10/1989  Ikenaga et al. .................. 364/491 X

*Primary Examiner*—Parshotam S. Lall
*Assistant Examiner*—Edward R. Cosimano
*Attorney, Agent, or Firm*—Staas & Halsey

[57] ABSTRACT

In a method of manufacturing reticules of the present invention, device pattern data is generated by shrinking (or magnifying) the pregenerated device pattern by calculation with determined shrinking ratio and meanwhile it is combined with alignment mark data of pregenerated alignment mark pattern in the determined shape and size and the combined data is then converted to the exposure data. As a result, in generating the reticule by shrinking the device pattern, a reticule having no positional displacement between the device pattern and alignment mark pattern can be easily generated in high efficiency.

4 Claims, 3 Drawing Sheets

METHOD OF MANUFACTURING A RETICULE

BACKGROUND OF THE INVENTION

1. Field of the Invention

The present invention relates to a method of manufacturing a reticule or an optical mask employed in fabricating semiconductor devices.

2. Description of the Related Art

In generating a mask for manufacture of a semiconductor device, two reticules are prepared, one for a device pattern, which is, for example, 10 times magnification of an LSI chip and another one, which is, for example, 10 times magnification of an alignment mark. The two reticules are prepared by the use of data of pattern of the semiconductor device such as LSI (hereinafter referred to as device pattern) and the alignment mark pattern data, which are respectively generated by a design tool such as CAD (Computer Aided Design). At the time of manufacturing the mask, the device pattern is optically shrunken to 1/10 from the reticule of device pattern and it is then exposed onto a chromium mask plate. Next, the alignment mask pattern shrunken to 1/10 is additionally exposed from the alignment mark reticule onto the chromium mask plate so as to generate a sheet of mask.

However, since the exposure is done twice using two reticules for the device pattern and the alignment mark, respectively, it is impossible to entirely prevent displacement between the device pattern and alignment mark on the chromium mask plate at the exposure, no matter how carefully the processing is conducted. Moreover, as explained above, since two reticules are required to manufacture a sheet of mask, a considerable number of procedures are necessary for manufacturing both the reticules, resulting in a problem that the manufacturing cost becomes high.

As a method of overcoming such problems, it has been proposed that the alignment mark data is combined in the device pattern data, the combined data is previously shrunken by a predetermined reduction factor, thereafter such data is converted to the exposure data and a reticule is manufactured by the use of such exposure data. However, in this case, the sizes of not only the device pattern but also the alignment mark are concurrently shrunken. On the other hand, the alignment mark and its position are originally set (i.e., prior to being shrunken) to an individual exposing apparatus. Therefore, the exposing apparatus cannot detect the shrunken alignment mark; accordingly, it cannot use such combined data. For this reason, it has been necessary to perform such a troublesome procedure as generating the alignment mark data, whose size is previously changed by calculation according to the shrinking ratio, and combining it with the device pattern data.

SUMMARY OF THE INVENTION

It is an object of the present invention to provide a reticule manufacturing method which can easily and inexpensively manufacture a highly precise reticule having no positional displacement between the device pattern and alignment mark, can use the alignment mark without shrinking its size even if the pattern data is shrunken in the pattern shrinking process, and can quickly generate the exposure data for reticule manufacturing.

In the method of manufacturing a reticule according to the present invention, data is obtained by shrinking (or magnifying) the previously generated device pattern through calculation with a predetermined ratio, and it is combined with previously prepared data of the alignment mark pattern of predetermined shape and size, and the thus combined data is converted to an exposure data.

The above-mentioned features and advantages of the present invention, together with other objects and advantages, will become apparent and will be more fully described hereinafter with reference to the accompanying drawings forming a part hereof, wherein like numerals refer to like parts throughout.

PREFERRED EMBODIMENT OF THE INVENTION

An embodiment of the method of manufacturing reticule according to the present invention will be explained with reference to the accompanying drawings.

Figure 1:
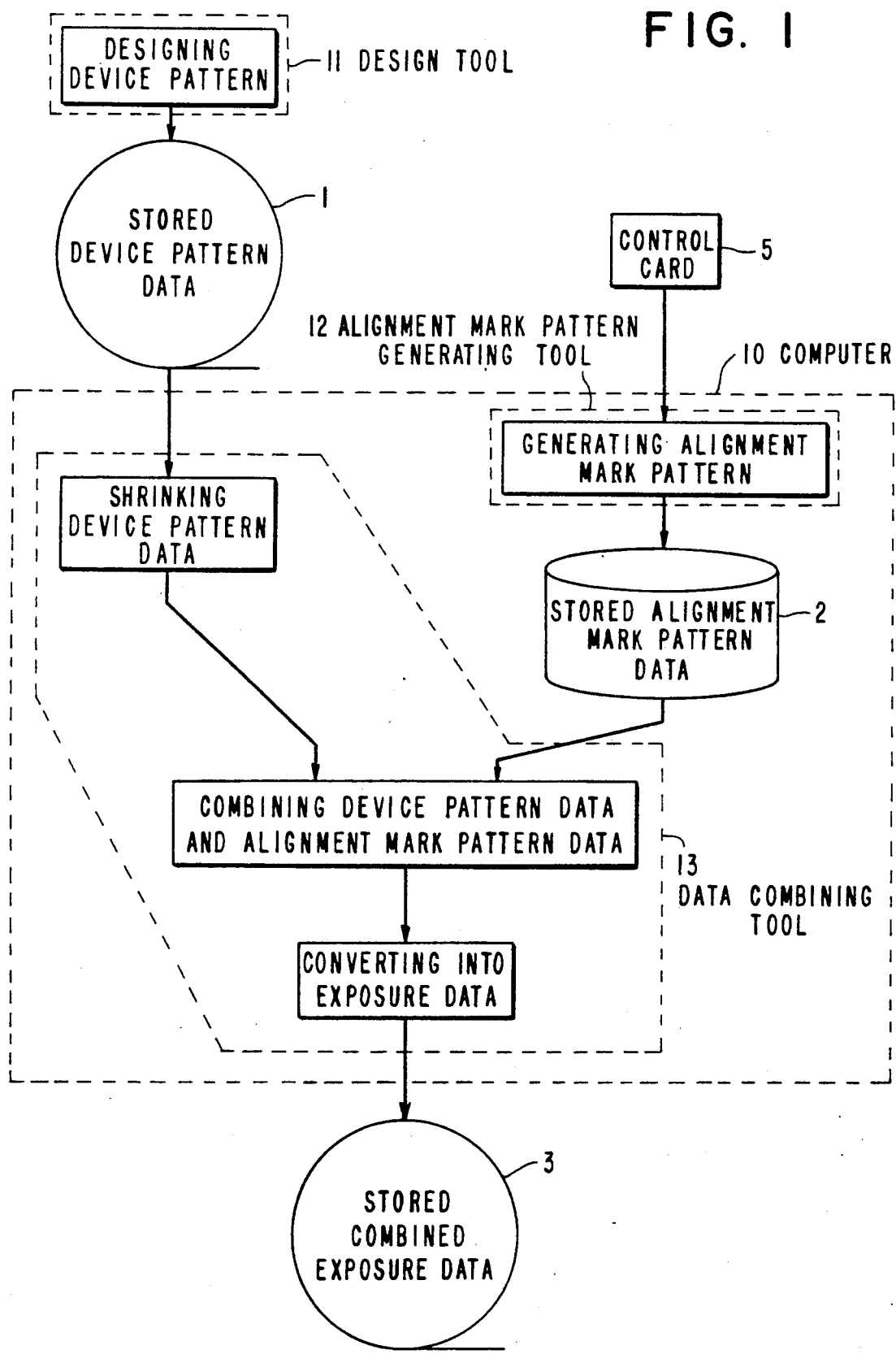
FIG. 1 is a schematic diagram showing an apparatus and operation, embodying the present invention.
Figure 2:
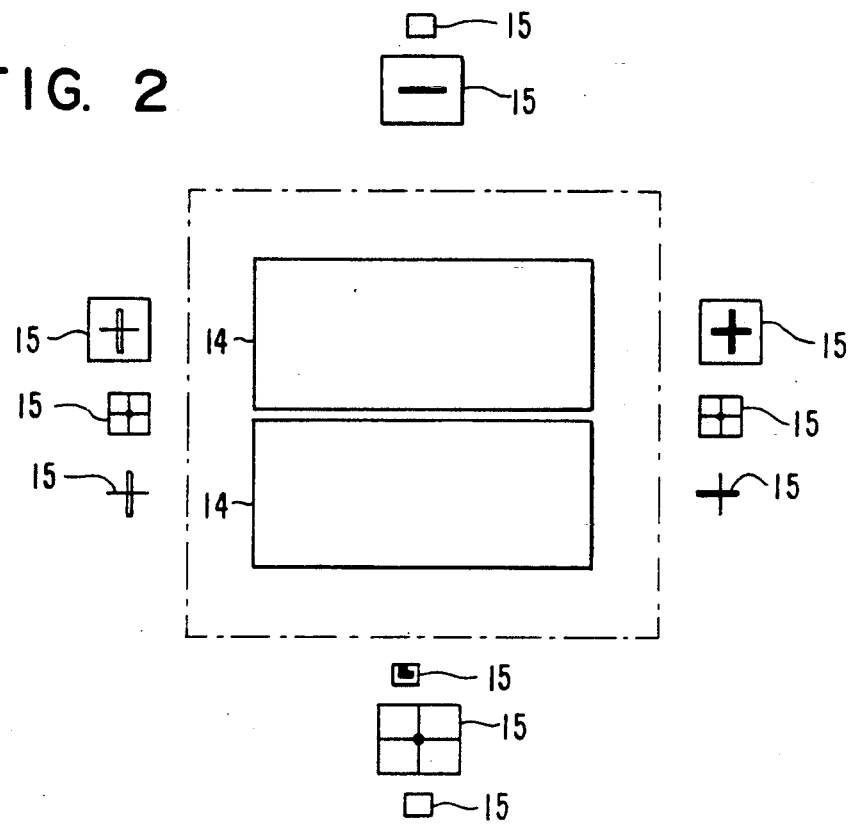
FIG. 2 is a pattern combining the stored device pattern data (data pattern having the shrinking ratio of 1:1) and the alignment mark data.

FIG. 1 schematically shows an embodiment of the structure and flowchart of the present invention. A CAD apparatus is used as a design tool 11 through a terminal called a work station. Device pattern data of device pattern 14 shown in FIG. 2 is generated by the design tool 11 and is stored on a recording medium, such as a magnetic tape. This stored device pattern data 1 is read out upon requirement so as to be utilized for regeneration of the device pattern 14. An alignment mark pattern generating tool 12 is a kind of software for operating a computer system 10 and also generates alignment mark pattern data 2 (hereinafter referred to as mark pattern data) of a plurality of alignment mark patterns 15 having the format and size required by the exposing apparatus to be used later. The data for such a shape and a size is installed in advance in the alignment mark data generating tool 12 by, for example, a control card 5. Data combining tool 13, which is a kind of software for operating the computer system 10, generates exposure data 3 which is an exposure pattern to be formed on the reticule according to the device pattern data 1 and the alignment mark data 2. Namely, the data combining tool 13 reads the device pattern data 1 stored on the recording medium, and shrinks the read data according to the required shrinking ratio by calculation. Meanwhile data combining tool 13 reads the alignment mark pattern data 2 stored in, for example, a hard disk and combines both the data. Moreover, the data combining tool 13 converts such combined data into the pattern data which is the proper size to be used by the exposure apparatus to be used later so as to complete the combined exposure data 3, and stores it on the recording medium, for example, a magnetic recording tape.

FIG. 2 shows a pattern combining the stored device pattern data 1 (device pattern having the shrinking ratio of 1:1) and the alignment mark data 2.

Figure 3:
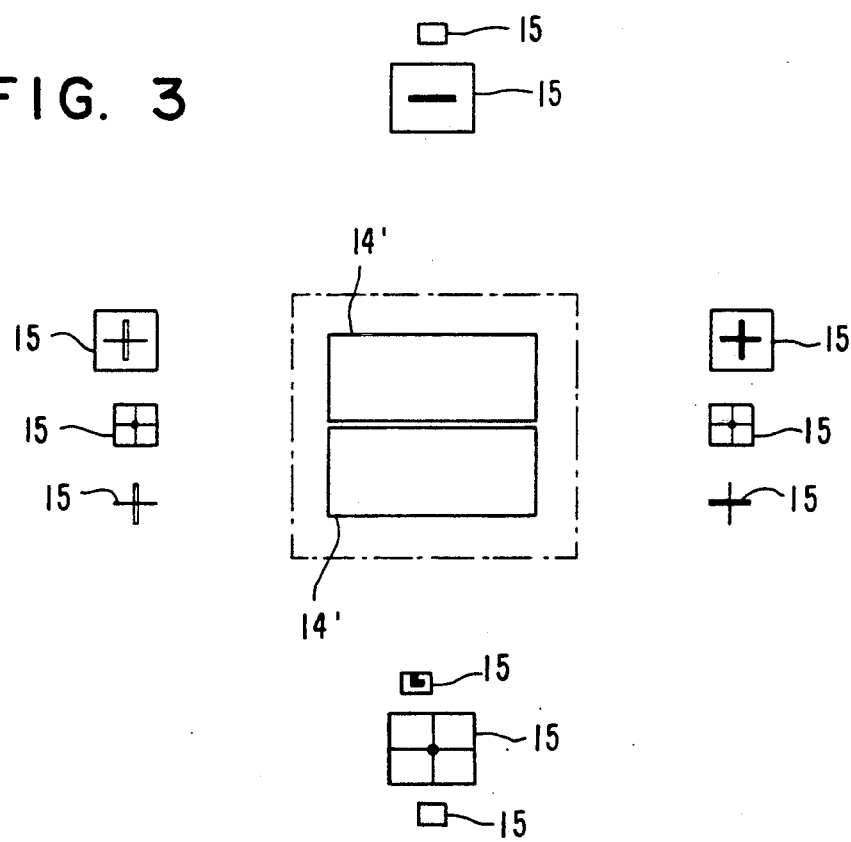
FIG. 3 shows a reticule pattern generated by shrinking the device pattern data according to the present invention.

FIG. 3 shows a first example of the combined pattern according to the present invention. Namely, data is generated by shrinking the device pattern data 1 (for example, by a shrinking ratio of 0.6 in this embodiment) and it is combined with the alignment mark data 2. The area surrounded by chains indicates the shrunken region. Namely, a plurality of alignment marks 15 are left in the same size and same position as the marks 15 shown in FIG. 2.

Figure 4:
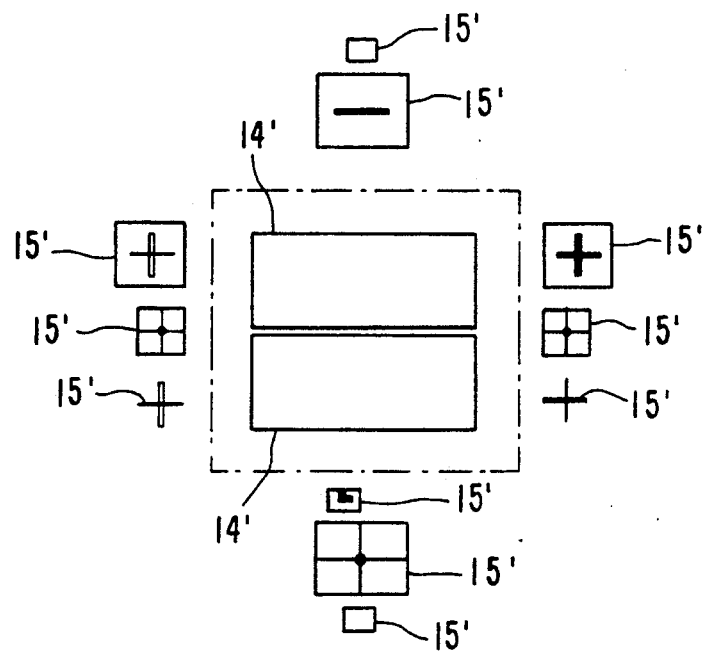
FIG. 4 shows a reticule pattern generated by shrinking the device data pattern and also shrinking the distance between the alignment marks according to the present invention.

FIG. 4 shows a second example of a combined pattern according to the present invention. The device pattern 14' is shrunken to 60% of the combined pattern like the case of FIG. 3. The shape and size of the alignment mark pattern 15' are the same as those of FIG. 3. However, the distance between the marks 15' and an interval between the mark 15' and shrunken device pattern 14' are shrunken (60%) from the distance between the original marks 15, and the distance between the original mark 15 and original device pattern 14 shown in FIG. 2. Although not illustrated, the shrunken alignment mark location and the not-shrunken alignment mark location may be mixed.

Figure 5:
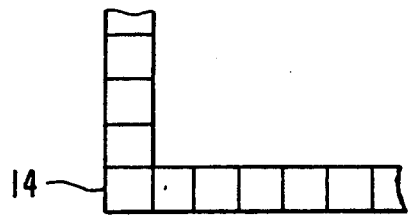
FIG. 5 is an enlarged view of a part of the pattern combined and converted to the exposure data according to the present invention.

In FIG. 2 to FIG. 5, since the alignment marks 15 and 15' may take a variety of shapes, all of the alignment marks are denoted representatively with the same numerals. FIG. 5 shows an enlarged view of a part of the combined patterns 14', 15' shown in FIG. 3 and FIG. 4 after the patterns are converted to the exposure data. The exposure data constitutes the lines in the patterns in FIGS. 3-4, with continuation of small square patterns depending on the specification of the exposing apparatus not illustrated. In addition to this square shape, a triangle shape may sometimes be employed.

In this embodiment, a device pattern is shrunken; however, it is apparent that the present invention can also be applied to such a case that device pattern is magnified.

In the method of the present invention described above, when the shrinking process, is required for the exposure data for reduction of chip size, it is enough to execute the shrinking process only to the device pattern data 1. Therefore, the designer's efforts can be concentrated on the circuit design because the circuit designer's subsidiary work, for example, preliminary modification of the alignment mark 1 (e.g., size magnification by the inverse number of the shrinking ratio through calculation of the alignment mark data 2 depending on the shrinking ratio of device pattern data 1) can be eliminated. Thereby, one of the causes of design error can be eliminated and reliability of the semiconductor device can be improved.

Moreover, since the device pattern data 1 and the alignment mark data 2 are generated individually, and combined in the computer system, positional displacement between the device pattern 14 and alignment mark 15 can be entirely eliminated in the above-mentioned reticule manufactured by the combined exposure data 3.

Though in the above-described embodiment the description is referred to a method of manufacturing a reticule, it is apparent that the above-described method of the present invention can be embodied in a method of manufacturing a photo mask employed in fabricating semiconductor devices.

The many features and advantages of the invention are apparent from the detailed specification and thus, it is intended by the appended claims to cover all such features and advantages of the system which fall within the true spirit and scope of the invention. Further, since numerous modifications and changes may readily occur to those skilled in the art, it is not desired to limit the invention to the exact construction and operation shown and described, and accordingly, all suitable modifications and equivalents may be resorted to, falling within the scope of the invention.

What I claim is:

1. A method of manufacturing a reticule employed in manufacturing a semiconductor device using a computer, comprising the steps of:
   generating first device pattern data;
   storing said first pattern data in first data storing means;
   reading said first device pattern data stored in said first data storing means;
   shrinking a size of said first device pattern data so as to generate second pattern data;
   generating alignment mark pattern data which has a predetermined shape and a predetermined size;
   combining in the computer said second device pattern data and said alignment mark pattern data so as to produce combined pattern data; and
   operating an exposure apparatus to be employed in manufacturing the reticule based on said combined pattern data.

2. A method recited in claim 1, wherein said step of generating alignment mark pattern data is carried out by reading alignment mark pattern data prepared and stored in second data storing means in advance.

3. A method of manufacturing a reticule employed in manufacturing a semiconductor device using a computer, comprising the steps of:
   generating first device pattern data;
   storing said first device pattern data in first data storing means;
   reading said first device pattern data stored in said first data storing means;
   expanding a size of said first device pattern data so as to generate second device pattern data;
   generating alignment mark pattern data which has a predetermined shape and a predetermined size;
   combining in the computer said second device pattern data and said alignment mark pattern data so as to produce combined pattern data; and
   operating an exposure apparatus to be employed in manufacturing the reticule based on said combined pattern data.

4. A method as recited in claim 3, wherein said step of generating alignment mark pattern data is carried out by reading alignment mark pattern data prepared and stored in second data storing means in advance.

* * * * *